(12) United States Patent
Noguchi et al.

(10) Patent No.: US 10,134,749 B2
(45) Date of Patent: Nov. 20, 2018

(54) SEMICONDUCTOR MEMORY DEVICE

(71) Applicant: Toshiba Memory Corporation, Tokyo (JP)

(72) Inventors: Mitsuhiro Noguchi, Chigasaki Kanagawa (JP); Yoshitaka Kubota, Sagamihara Kanagawa (JP); Yasuyuki Baba, Ayase Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/490,064

(22) Filed: Apr. 18, 2017

(65) Prior Publication Data
US 2017/0309634 A1 Oct. 26, 2017

(30) Foreign Application Priority Data
Apr. 20, 2016 (JP) ................ 2016-084577

(51) Int. Cl.
| | |
|---|---|
| *H01L 27/115* | (2017.01) |
| *H01L 27/11524* | (2017.01) |
| *H01L 27/11519* | (2017.01) |
| *H01L 27/11556* | (2017.01) |
| *H01L 27/11565* | (2017.01) |
| *H01L 27/1157* | (2017.01) |

(Continued)

(52) U.S. Cl.
CPC .... *H01L 27/11524* (2013.01); *H01L 27/1157* (2013.01); *H01L 27/11519* (2013.01); *H01L 27/11556* (2013.01); *H01L 27/11565* (2013.01); *H01L 27/11575* (2013.01); *H01L 27/11582* (2013.01)

(58) Field of Classification Search
CPC ............ H01L 27/115; H01L 27/11524; H01L 27/11519; H01L 27/11556; H01L 27/11565; H01L 27/11582
See application file for complete search history.

(56) References Cited

U.S. PATENT DOCUMENTS

| | | |
|---|---|---|
| 7,852,675 B2 | 12/2010 | Maejima |
| 7,936,004 B2 | 5/2011 | Kito et al. |
| 8,372,720 B2 | 2/2013 | Fukuzumi et al. |

(Continued)

FOREIGN PATENT DOCUMENTS

JP 2007266143 A 10/2007

*Primary Examiner* — Phuc Dang
(74) *Attorney, Agent, or Firm* — Patterson & Sheridan, LLP

(57) ABSTRACT

A semiconductor memory device comprises a memory block including conductive layers at different levels from a substrate and separated from each other by a first insulation material. A memory pillar extends through the first conductive layers. A hookup region is adjacent to the memory block and includes conductive layers stacked on the substrate at levels from the substrate that corresponds to the conductive layers in the memory block. An isolation region is between the memory block and the hookup region and includes first insulating layers of a second insulating material different than the first insulating material. Each first insulating layer is at a level from the substrate that corresponds to one of the first conductive layers and each first insulating layer is between one of the conductive layers in the memory block and one of the conductive layers in hookup region.

13 Claims, 17 Drawing Sheets

(51) Int. Cl.
*H01L 27/11582* (2017.01)
*H01L 27/11575* (2017.01)

(56) References Cited

U.S. PATENT DOCUMENTS

| | | | |
|---|---|---|---|
| 8,952,426 B2 | 2/2015 | Maejirna | |
| 9,646,880 B1* | 5/2017 | Takaki | H01L 21/76877 |
| 2011/0272754 A1* | 11/2011 | Tang | H01L 27/0688 |
| | | | 257/314 |
| 2011/0284946 A1 | 11/2011 | Kiyotoshi | |
| 2016/0260722 A1* | 9/2016 | Baba | H01L 27/11582 |

* cited by examiner

SEMICONDUCTOR MEMORY DEVICE

CROSS-REFERENCE TO RELATED APPLICATION

This application is based upon and claims the benefit of priority from Japanese Patent Application No. 2016-084577, filed Apr. 20, 2016, the entire contents of which are incorporated herein by reference.

FIELD

Embodiments described herein relate generally to a semiconductor memory device and a manufacturing method for the same.

BACKGROUND

A NAND flash memory where memory cells are stacked three-dimensionally is known.

DETAILED DESCRIPTION

Figure 1:
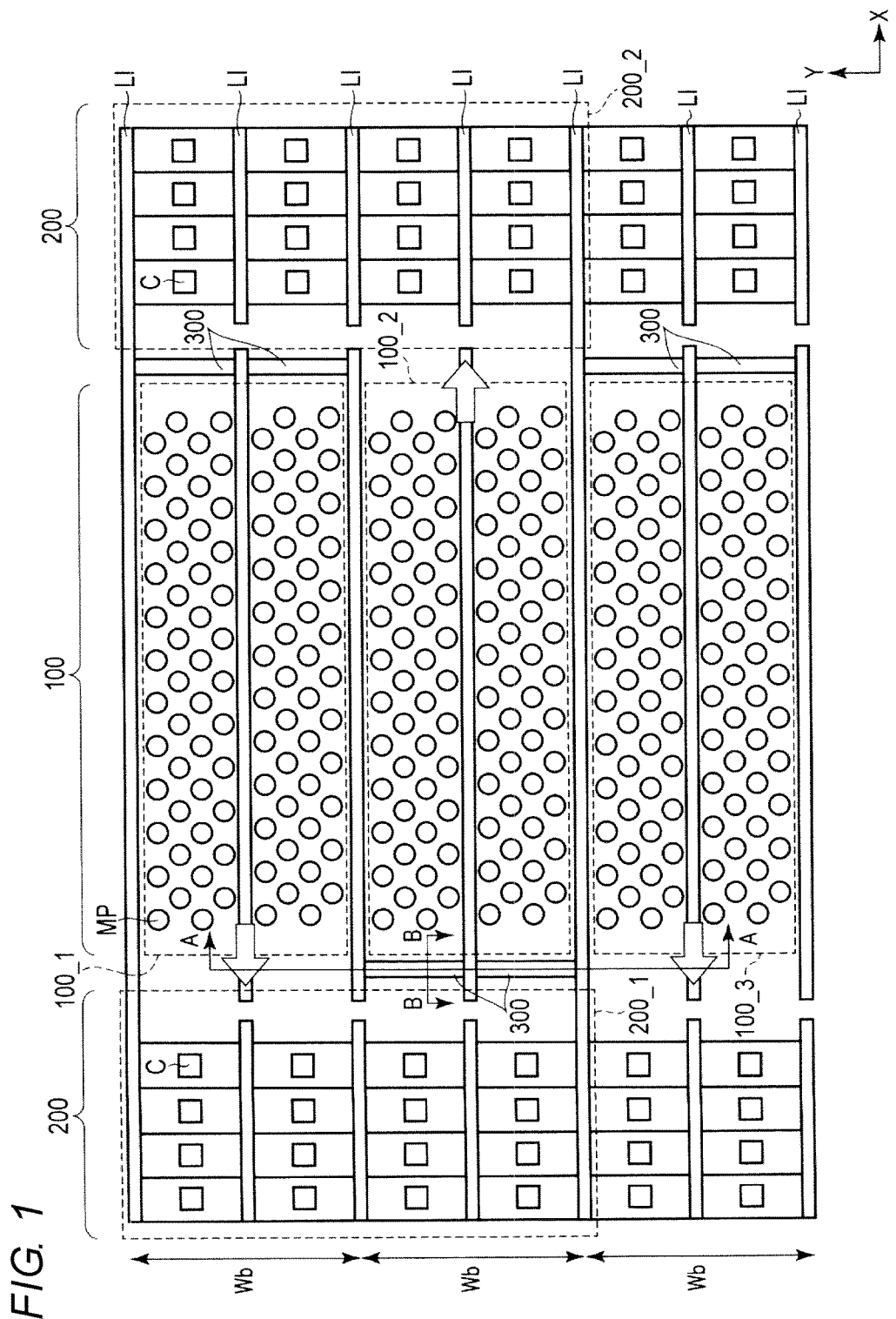
FIG. 1 is a plan view illustrating a configuration of a semiconductor memory device according to an embodiment.

In general, according to one embodiment, a semiconductor memory device comprises a first memory block that includes a plurality of first conductive layers stacked on a substrate, each first conductive layer being at a different level in a first direction from the substrate and separated from adjacent first conductive layers in the first direction by a first insulation material; and a first memory pillar extending in the first direction through the plurality of first conductive layers. The semiconductor memory device further comprises a first hookup region adjacent in a second direction to the first memory block and having a plurality of second conductive layers stacked on the substrate, each second conductive layer being at a level in the first direction from the substrate that corresponds to one of the plurality of first conductive layers. A first isolation region is between the first memory block and the first hookup region in the second direction and including a plurality of first insulating layers of a second insulating material different than the first insulating material, each of the first insulating layers being at a level in the first direction from the substrate that corresponds to one of the plurality of first conductive layers. Each of first insulating layers is between one of the plurality of first conductive layers and one of the plurality of second conductive layers in the second direction.

Example embodiments of the present disclosure will be described hereinafter with reference to the accompanying drawings. In the drawings, the same elements are denoted by the same reference symbols in each drawing.

Embodiments

A semiconductor memory device according to an embodiment will be described hereinafter with reference to FIGS. 1 to 18. A three-dimensional stacked NAND flash memory will be described herein as an example semiconductor memory device. Furthermore, as used herein "connection" includes not only a case of direct connection but also a case of indirect connection via another element.

Configuration Example

FIG. 1 is a plan view illustrating a configuration of the semiconductor memory device according to the embodiment. Note that FIG. 1 does not illustrate bit lines BL and source lines SL (see FIG. 2).

As illustrated in FIG. 1, the semiconductor memory device includes a memory cell array region 100 and hookup regions 200.

In this example, the memory cell array region 100 includes first memory block 100_1, second memory block 100_2, and third memory block 100_3. The memory blocks (100_1 to 100_3) extend along an X direction and are arranged along a Y direction. The first, second, and third memory blocks 100_1, 100_2, 100_3 are each similar in configuration. The first memory block 100_1 will be described hereinafter by way of example.

The first memory block 100_1 includes a plurality of memory pillars MP. The plurality of memory pillars MP are arranged in an array in the X direction and the Y direction. Furthermore, here memory pillars MP adjacent in the X direction (or Y direction) are offset from each other by a half pitch in the Y direction (or X direction). That is, the plurality of memory pillars MP is in a staggered arrangement in the X direction and the Y direction. A width (block width) of the first memory block 100_1 in the Y direction is a width Wb.

A source line contact LI (isolation region) extending in the X direction is provided between adjacent memory blocks. The memory blocks are thereby isolated from each other. A source line contact LI is also provided in a central portion (middle portion) for each memory block.

Note that the number of memory pillars MP and the number of source line contacts LI are arbitrary.

Figure 2:
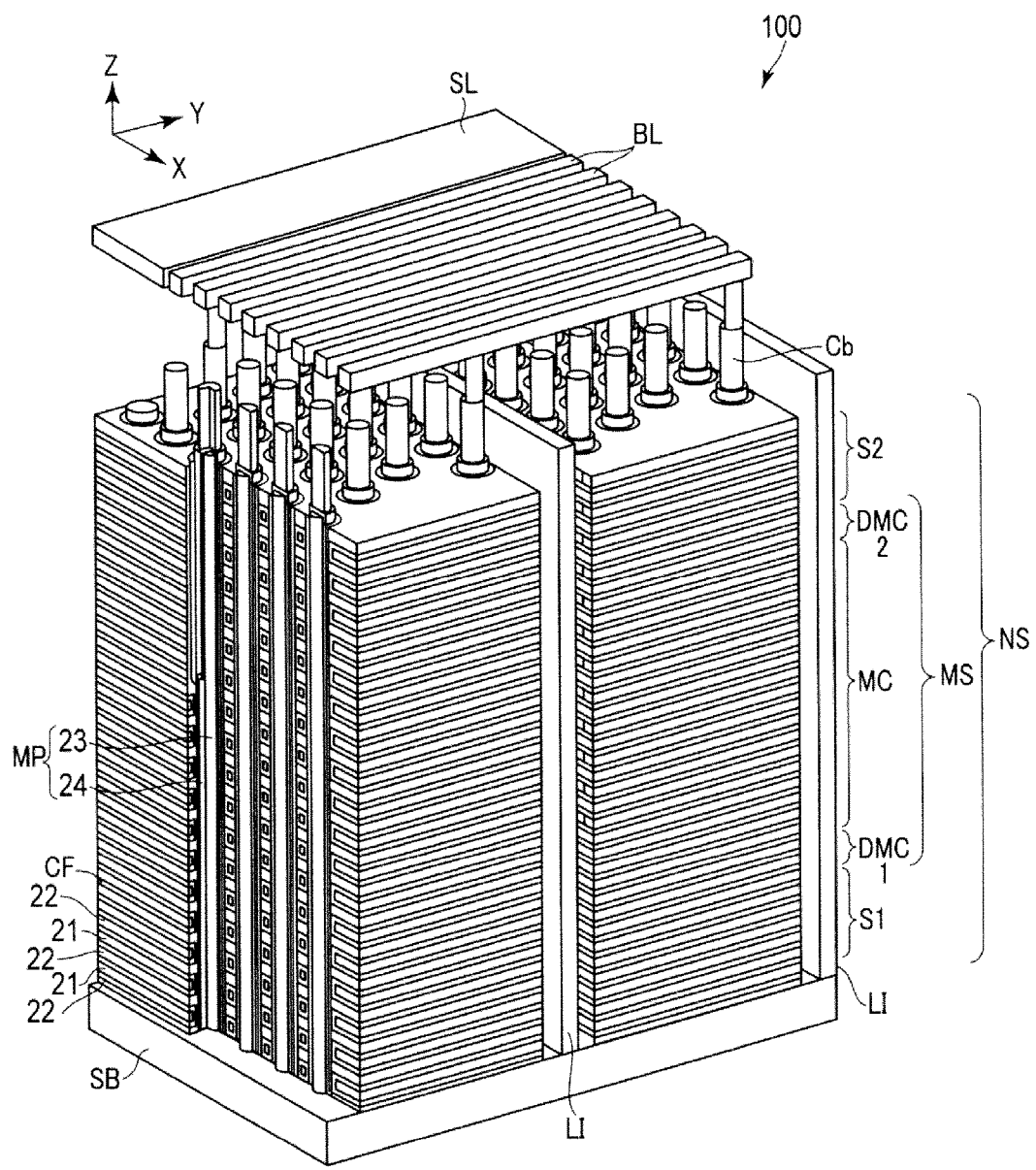
FIG. 2 is a perspective view illustrating a configuration of a memory cell array region in the semiconductor memory device according to the embodiment.
Figure 3:
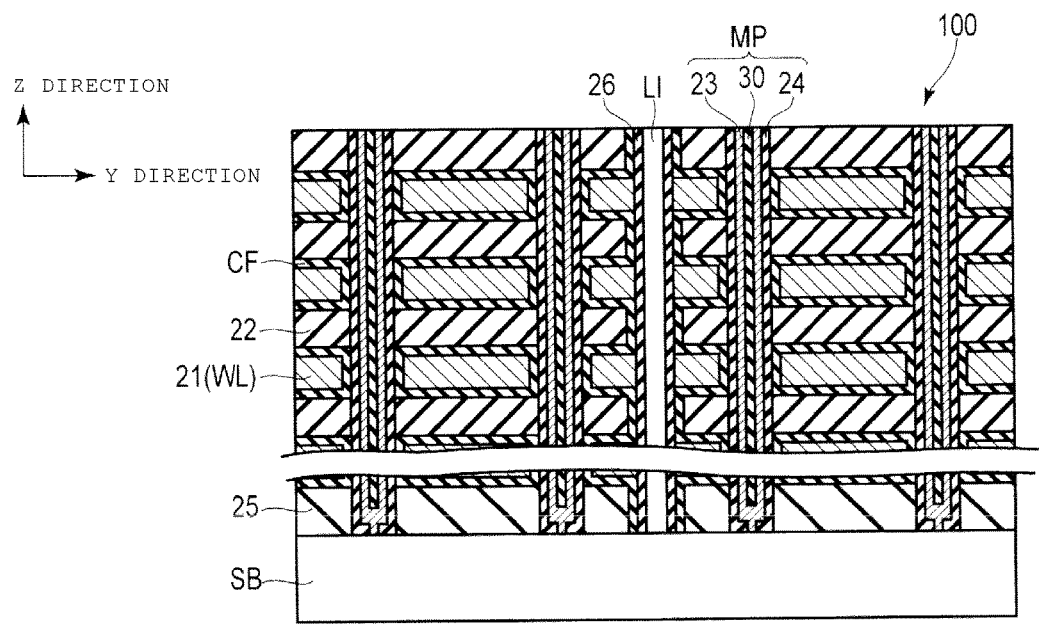
FIG. 3 is a cross-sectional view illustrating the configuration of the memory cell array region in the semiconductor memory device according to the embodiment.
Figure 4:
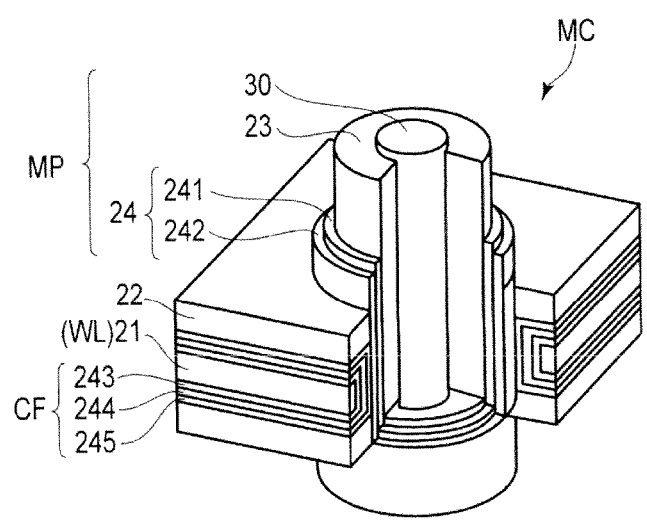
FIG. 4 is a perspective view illustrating a configuration of a memory cell in the semiconductor memory device according to the embodiment.

FIG. 2 is a perspective view illustrating a configuration of the memory cell array region 100 in the semiconductor memory device according to the embodiment. FIG. 3 is a cross-sectional view illustrating the configuration of the memory cell array region 100 in the semiconductor memory device according to the embodiment. FIG. 4 is a perspective view illustrating a configuration of a memory cell MC in the semiconductor memory device according to the embodiment. Note that FIG. 2 does not illustrate insulating layers 25, 26, and the like (see FIG. 3).

As illustrated in FIGS. 2 and 3, in the memory cell array region 100, a plurality of insulating layers 22 and a plurality of conductive layers 21 are alternately stacked on a semiconductor substrate SB via the insulating layer 25. The insulating layers 22 and 25 contain, for example, an insulating material such as silicon dioxide ($SiO_2$). The conductive layers 21 contain, for example, a metallic material such as tungsten (W) or doped polysilicon.

A stacked film CF is provided to cover of the outside of each conductive layer 21. As illustrated in FIG. 4, the stacked film CF includes a barrier metal 243, a block insulating layer 244, and a block high-dielectric layer 245 in this order from the conductive layer 21-side. The block insulating layer 244 contains, for example, silicon dioxide. The block high-dielectric layer 245 contains, for example, alumina ($Al_2O_3$). The barrier metal 243 contains, for example, a metal nitride such as titanium nitride (TiN), tungsten nitride (WN), or a tantalum nitride (TaN).

The memory pillars MP are provided within the plurality of insulating layers 22, the plurality of conductive layers 21, and the insulating layer 25 so as to extend from upper surfaces of the insulating layers 22, the conductive layers 21, and the insulating layer 25 to lower surfaces thereof. The lower ends of the memory pillars MP are each connected to the semiconductor substrate SB and the upper ends of the memory pillars MP are connected to a bit line BL. The memory pillars MP are cylindrical having an axial direction extending in a Z direction. Each of the memory pillars MP includes a core insulating layer 30, a semiconductor layer 23, and a memory layer 24 provided in the order from a center of the memory pillar MP.

The semiconductor layer 23 is provided to cover an outer circumference of the core insulating layer 30. The semiconductor layer 23 comes in contact with the semiconductor substrate SB on a lower end. The semiconductor layer 23 functions as a channel.

As illustrated in FIG. 4, the memory layer 24 is provided to cover an outer circumference of the semiconductor layer 23 and includes a tunnel insulating layer 241 and a charge storage layer 242. The tunnel insulating layer 241 is provided on the outer circumference of the semiconductor layer 23. The charge storage layer 242 is provided to cover the outer circumference of the tunnel insulating layer 241. The tunnel insulating layer 241 contains, for example, silicon dioxide. The charge storage layer 242 contains, for example, silicon nitride (SiN).

The source line contacts LI are provided within the insulating layers 22, the conductive layers 21, and the insulating layer 25 so as to extend through the insulating layers 22, conductive layers 21, and the insulating layer 25. Insulating layers 26 are provided between each source line contact LI and the insulating layers 22, the conductive layers 21, and the insulating layer 25 through which the source line contact LI passes. Lower ends of the source line contacts LI are connected to the semiconductor substrate SB and upper ends of the source line contacts LI are connected to the bit line BL. The source line contacts LI are plate-shaped extending in the X direction and the Z direction. The plurality of insulating layers 22, the plurality of conductive layers 21, and the insulating layer 25 are isolated from those adjacent in the Y-direction by the source line contacts LI. The source line contacts LI contain a metallic material such as tungsten or a semiconductor material such as silicon.

The memory pillars MP, the conductive layers 21, and the stacked films CF can be used to form various elements. More specifically, a selection transistor S1, a dummy cell DMC1, a plurality of memory cells MC, a dummy cell DMC2, and a selection transistor S2 are stacked in this order from the lower layer side (the semiconductor substrate SB side) and connected to each other in series. A dummy cell DMC1, a plurality of memory cells MC, and a dummy cell DMC2 form a memory string MS. A memory string MS and selection transistors S1 and S2 form a NAND string NS.

Note that the memory cell array region 100 may have other configurations. The configuration of the memory cell array region 100 may be as described in, for example, U.S. application Ser. No. 12/407,403 filed on Mar. 19, 2009 and entitled "Three-dimensional stacked nonvolatile semiconductor memory". The configuration of the memory cell array region 100 may also be as described in U.S. application Ser. No. 12/406,524 filed on Mar. 18, 2009 and entitled "Three-dimensional stacked nonvolatile semiconductor memory"; U.S. application Ser. No. 12/679,991 filed on Mar. 25, 2010 and entitled "Non-volatile semiconductor storage device and method of manufacturing the same"; or U.S. application Ser. No. 12/532,030 filed on September 18, 2009 and entitled "Semiconductor memory including three-dimensionally arranged cells and method for manufacturing same". The entire contents of these patent applications are incorporated herein by reference.

With reference back to FIG. 1, hookup regions 200 are separately provided on both sides, in the X direction, of the memory cell array region 100. The hookup region 200 on one side (left side in FIG. 1) of the memory cell array region 100 includes a first hookup region 200_1 whereas the hookup region 200 on the other side (right side in FIG. 1) thereof includes a second hookup region 200_2.

The first hookup region 200_1 allows pull-out and connection of word lines WL of the first memory block 100_1 whereas the second hookup region 200_2 allows pull-out and connection of word lines WL of the second memory block 100_2. That is, the word lines WL of the first hookup region 200_1 and the word lines WL of the first memory block 100_1 are provided on the same respective layers and are electrically connected (integrated) with each other whereas the word lines WL of the second hookup region 200_2 and the word lines WL of the second memory block 100_2 are provided on the same respective layers and are electrically connected (integrated) with each other. However, while the word lines WL of the first hookup region 200_1 and the word lines WL of the second memory block 100_2 are provided on the same respective layers they are electrically separated from each other by an insulating region 300. Likewise, the word lines WL of the second hookup region 200_2 and the word lines WL of the first memory block 100_1 are provided on the same respective layers but electrically separated from each other by an insulating region 300.

Each of the first and second hookup regions 200_1 and 200_2 has a width 2Wb in the Y direction. That is, the first hookup region 200_1 is provided on one side in the X direction to correspond to both the first and second memory blocks 100_1 and 100_2. Furthermore, the second hookup region 200_2 is provided on the other side in the X direction to correspond to both the first and second memory blocks 100_1 and 100_2. The first and second hookup regions 200 land 200_2 are similar in configuration. The first hookup region 200_1 will be described hereinafter by way of example.

Figure 5:
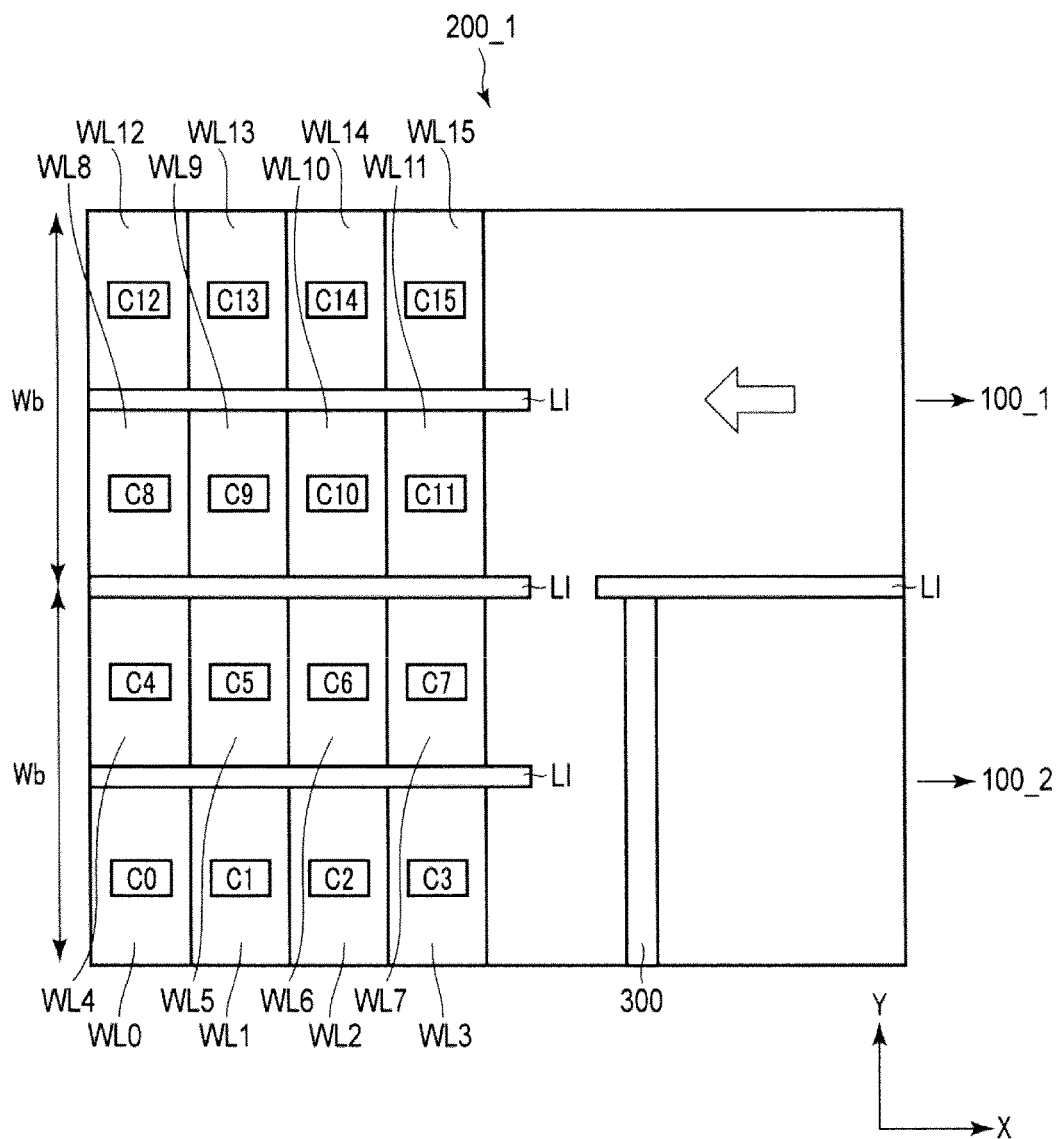
FIG. 5 is a plan view illustrating a configuration of a first hookup region in the semiconductor memory device according to the embodiment.
Figure 6:
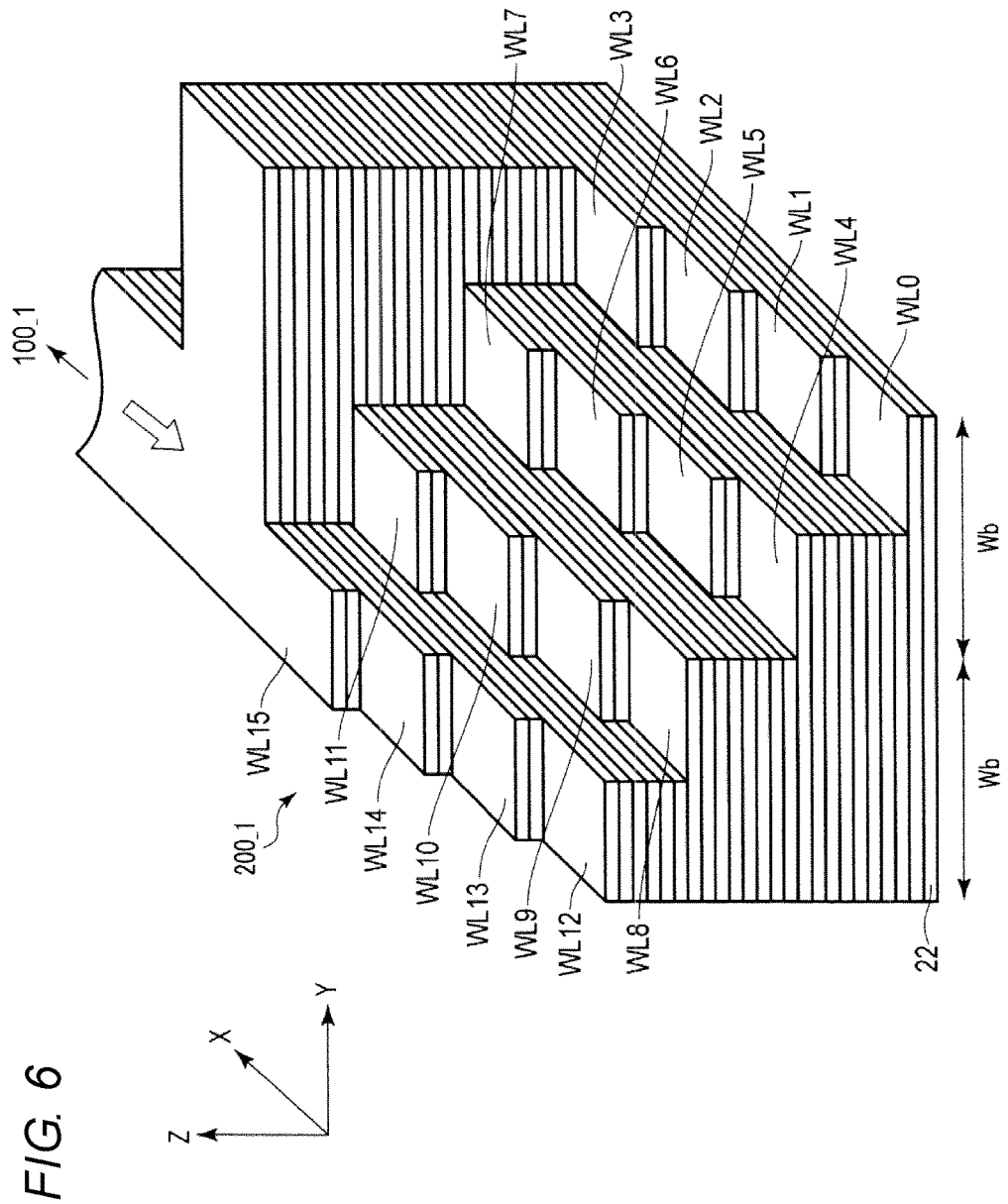
FIG. 6 is a perspective view illustrating the configuration of the first hookup region in the semiconductor memory device according to the embodiment.

FIG. 5 is a plan view illustrating a configuration of the first hookup region 200_1 in the semiconductor memory device according to the embodiment. FIG. 6 is a perspective view illustrating the configuration of the first hookup region 200_1 in the semiconductor memory device according to the embodiment. Note that FIG. 6 does not specifically illustrate the source line contacts LI and contacts C. Furthermore, while FIGS. 5 and 6 illustrate a case where the number of layers of the word lines L (conductive layers 21) is 16, the number of layers is not limited to 16 and may be more or less than 16.

As illustrated in FIG. 6, word lines WL0 to WL15 (formed by conductive layers 21) and the insulating layers 22 are alternately stacked in the first hookup region 200_1. The conductive layers 21 in the first hookup region 200_1 are provided on the same respective layers as the conductive layers 21 in the memory cell array region 100.

As illustrated in FIGS. 5 and 6, the word lines WL0 to WL15 are paired with the insulating layers 22 directly under the word lines WL0 to WL15, respectively to provide steps along the X direction and the Y direction in the first hookup region 200_1. More specifically, a group of the word lines WL0 to WL3, a group of the word lines WL4 to WL7, a group of the word lines WL8 to WL11, and a group of the word lines WL12 to WL15 are formed to provide steps in order from a lower side along the Y direction. The word lines WL0 to WL3 provide a row of steps from the lower side along the X direction. Likewise, the word lines WL4 to WL7 provide another row of steps from the lower side along the X direction, the word lines WL8 to WL11 provide yet another row of steps from the lower side along the X direction, and the word lines WL12 to WL15 provide still another row of steps from the lower side along the X direction.

Here, portions of upper surfaces of the respective word lines WL0 to WL15 are not covered by other word lines WL0 to WL15. In other words, the portions of the upper surfaces of the respective word lines WL0 to WL15 are exposed as steps. Contacts C0 to C15 are connected to the exposed portions of the upper surfaces of the word lines WL0 to WL15, respectively. The contacts C0 to C15 can be connected to word line drivers and the like (not specifically illustrated).

While FIG. 5 illustrates that a source line contact LI is provided between the group of the word lines WL0 to WL3 and the group of the word lines WL4 to WL7, another source line contact L1 is provide between the group of the word lines WL4 to WL7 and the group of the word lines WL8 to WL11, and still another source line contact L1 is provided between the group of the word lines WL8 to WL11 and the group of the word lines WL12 to WL15, these source line contacts LI are not necessarily provided. It suffices that the word lines WL0 to WL15 are integrated and electrically connected in the first hookup region 200_1 and the memory block 100_1, regardless of the presence of source line contacts LI.

With reference back to FIG. 1, an insulating region (isolation regions) 300 is provided between the first memory block 100_1 and the second hookup region 200_2 and another insulating region 300 is provided between the second memory block 100_2 and the first hookup region 200_1. The insulating regions 300 extend in the Y direction between the source line contacts LI that are among the memory blocks (for example, between the source line contact LI between the first memory block 100_1 and the second memory block 100_2 and the source line contact LI between the second memory block 100_2 and the third memory block 100_3). The insulating regions 300 isolate the first memory block 100_1 from the second hookup region 200_2 and isolate the second memory block 100_2 from the first hookup region 200_1.

Figure 7:
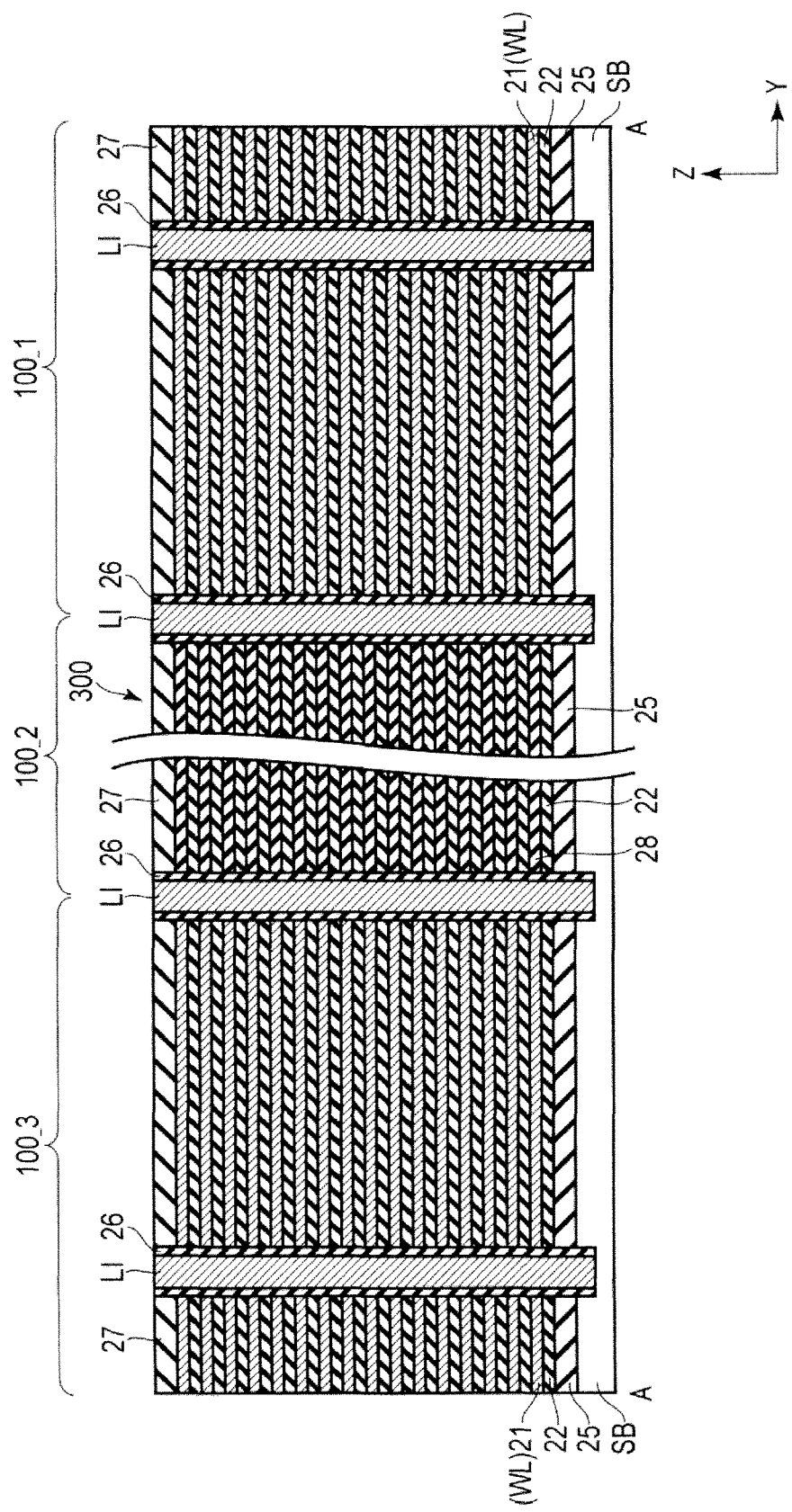
FIG. 7 is a cross-sectional view taken along a line A-A in FIG. 1.
Figure 8:
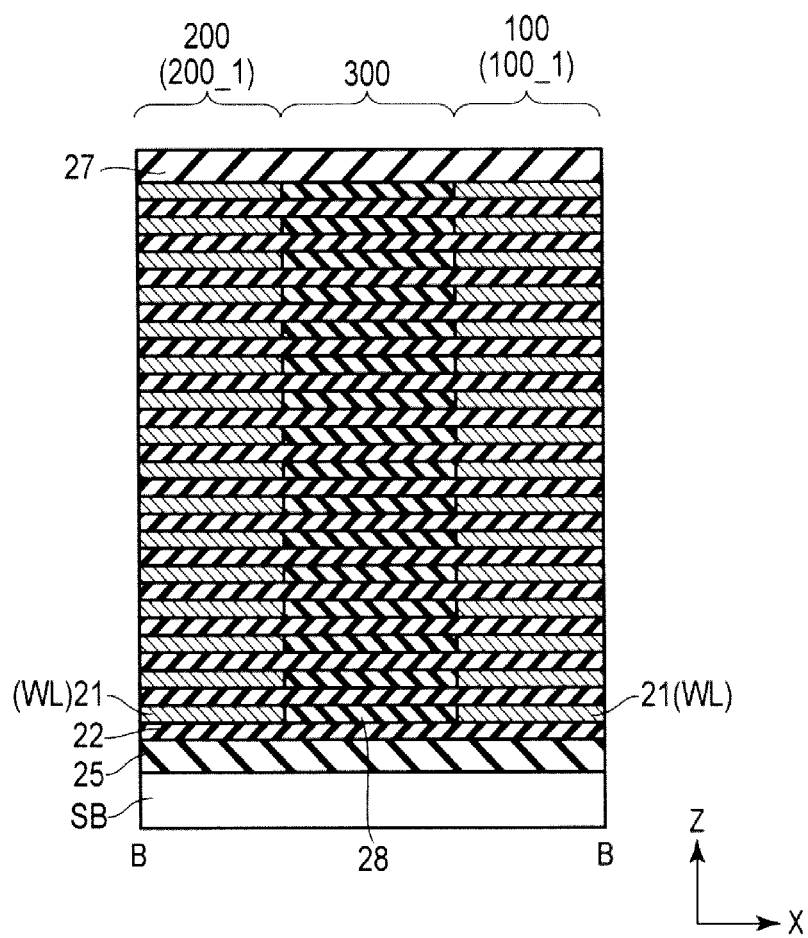
FIG. 8 is a cross-sectional view taken along a line B-B in FIG. 1.

FIG. 7 is a cross-sectional view taken along a line A-A in FIG. 1, and FIG. 8 is a cross-sectional view taken along a line B-B in FIG. 1. FIGS. 7 and 8 primarily illustrate the surroundings of the insulating region 300 between the second memory block 100_2 and the first hookup region 200_1. Note that FIGS. 7 and 8 do not illustrate the stacked films CF.

As illustrated in FIGS. 7 and 8, in the insulating region 300, a plurality of insulating layers 22 and a plurality of insulating layers 28 are alternately stacked on the semiconductor substrate SB via the insulating layer 25. Furthermore, an insulating layer 27 is provided on the uppermost insulating layer 28 and the uppermost conductive layer 21. The insulating layers 28 have a material different from the material of the insulating layers 26 and may be, for example, an insulating material such as silicon nitride.

The insulating layers 28 in the insulating region 300 are provided on the same layers as the conductive layers 21 in the memory cell array region 100 (second memory block 100_2) and as the conductive layers 21 in the hookup region 200 (first hookup region 200_1). That is, the insulating layers 28 in the insulating region 300 are provided between the conductive layers 21 in the second memory block 100_2 and the conductive layers 21 in the first hookup region 200_1 in the X direction. The insulating layers 28 in the insulating region 300 dielectrically isolate the conductive layers 21 in the second memory block 100_2 from the conductive layers 21 in the first hookup region 200_1.

(Manufacturing Method According to the Embodiment)

Figure 13:
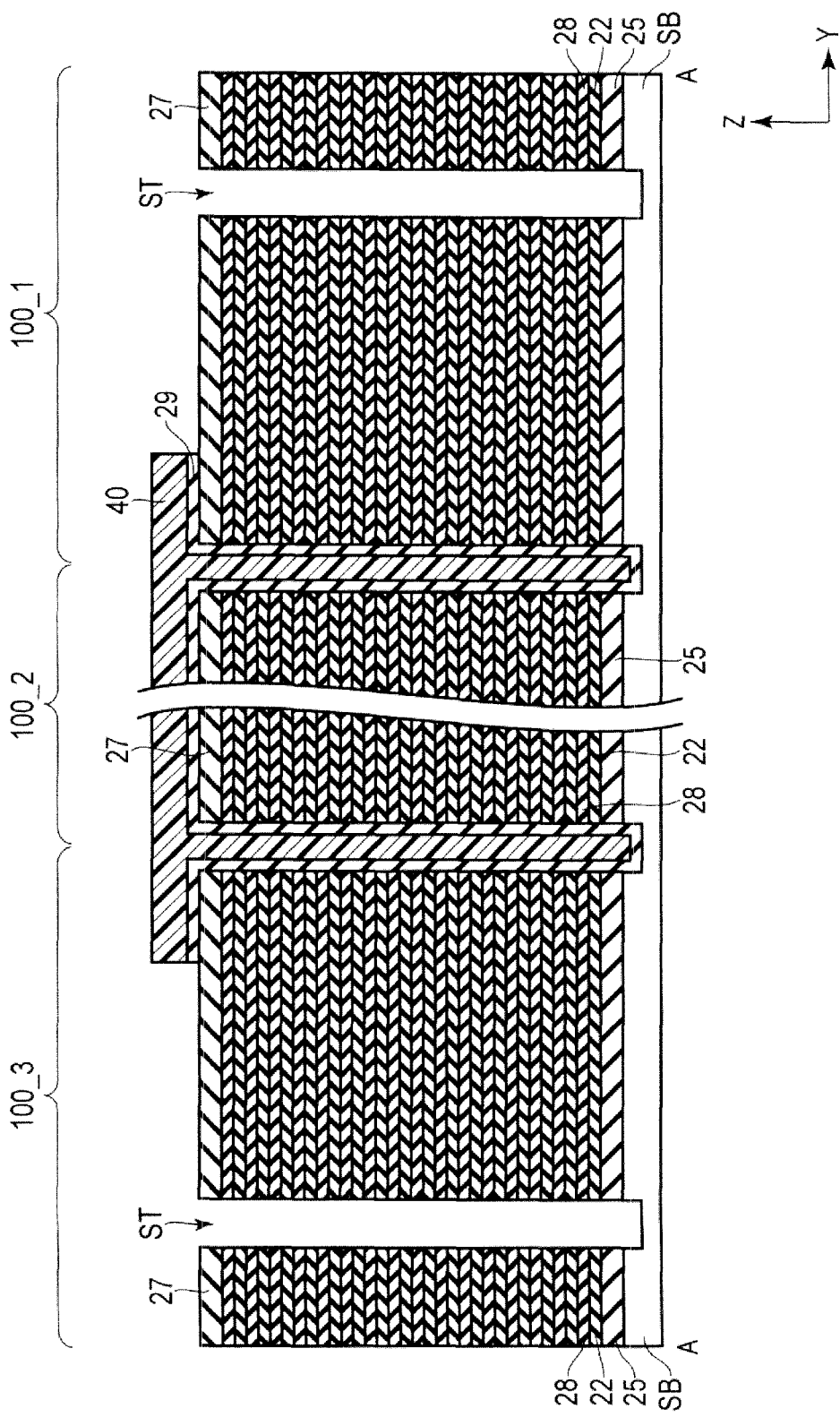
FIG. 13 is a cross-sectional view illustrating a manufacturing step subsequent to the manufacturing step in FIG. 11 for the semiconductor memory device according to the embodiment.
Figure 14:
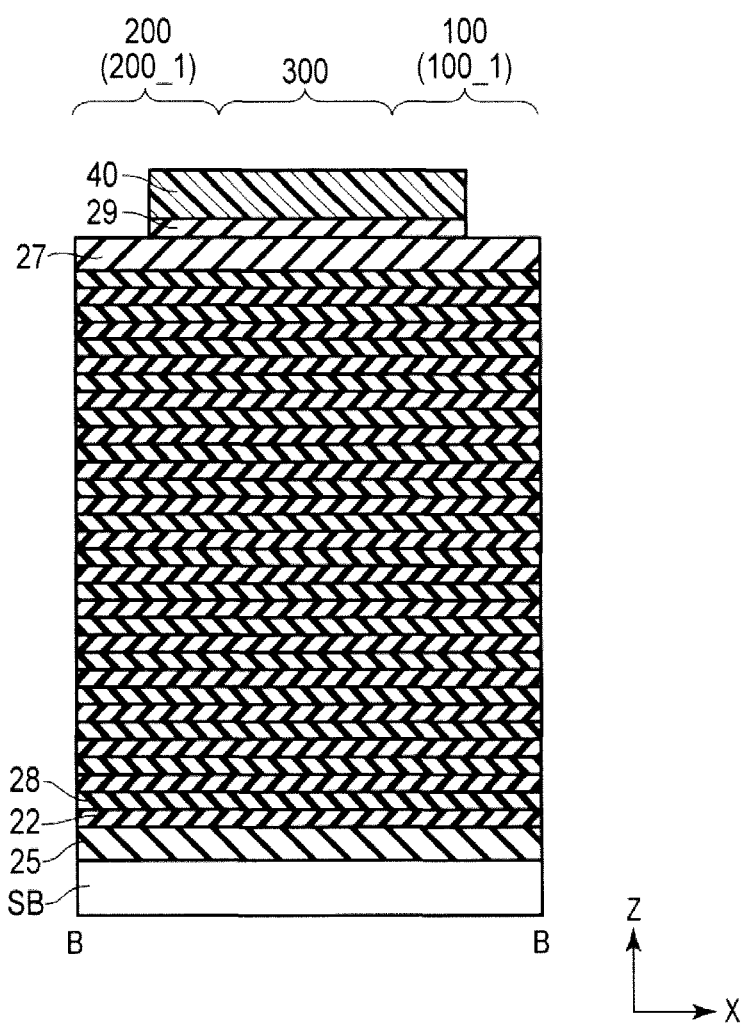
FIG. 14 is a cross-sectional view illustrating a manufacturing step subsequent to the manufacturing step in FIG. 12 for the semiconductor memory device according to the embodiment.
Figure 15:
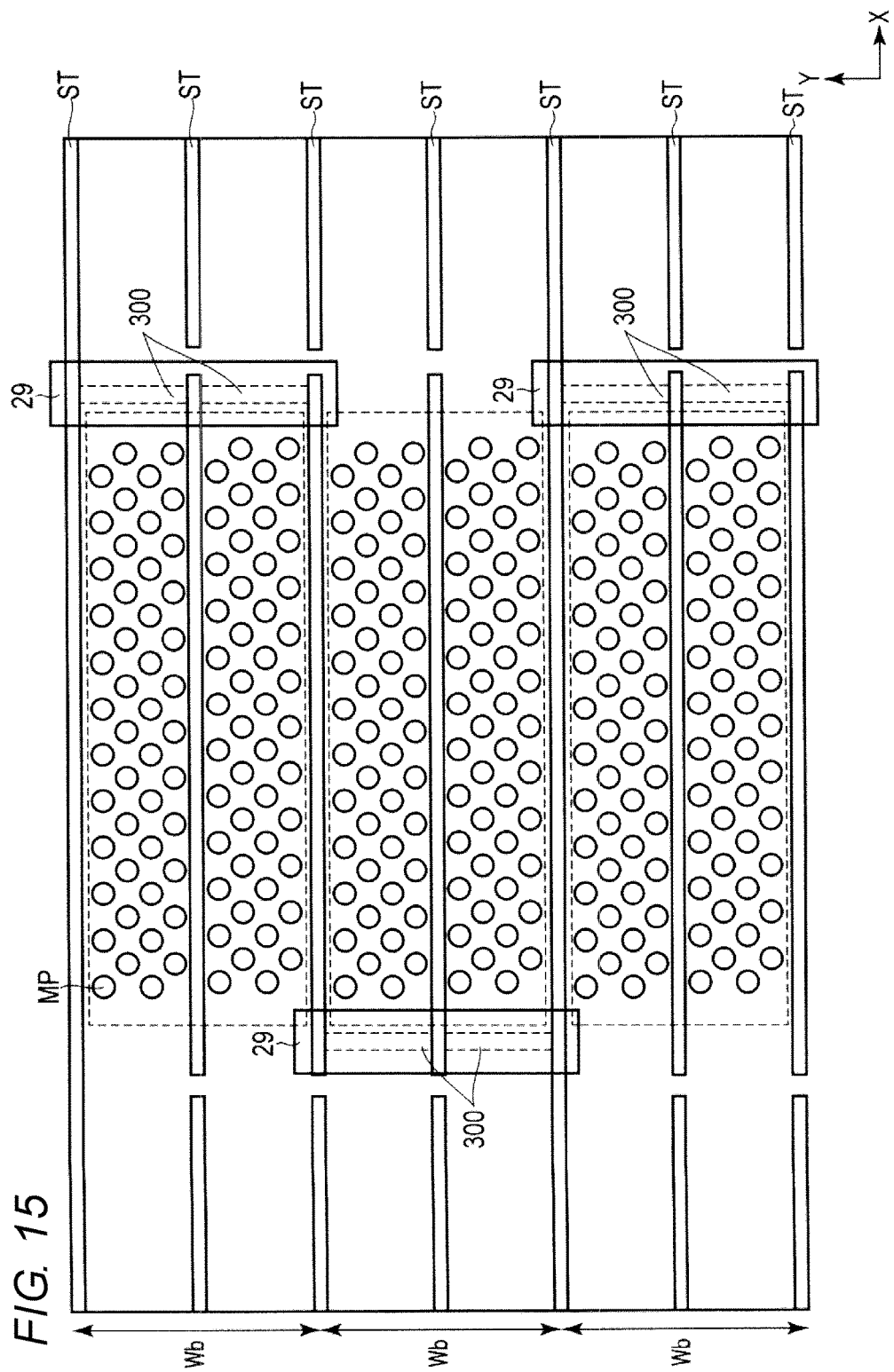
FIG. 15 is a plan view illustrating a manufacturing step for the semiconductor memory device according to the embodiment.

FIGS. 9 to 18 illustrate manufacturing steps for the semiconductor memory device according to the embodiment. More specifically, FIGS. 9, 11, 13, 16, and 18 correspond to cross-sectional views taken along the line A-A illustrated in FIG. 1 at various points in the processing, FIGS. 10, 12, 14, and 17 correspond to cross-sectional views taken along the line B-B illustrated in FIG. 1 at various points in the processing, and FIG. 15 is a plan view corresponding to the view of FIG. 1.

Figure 9:
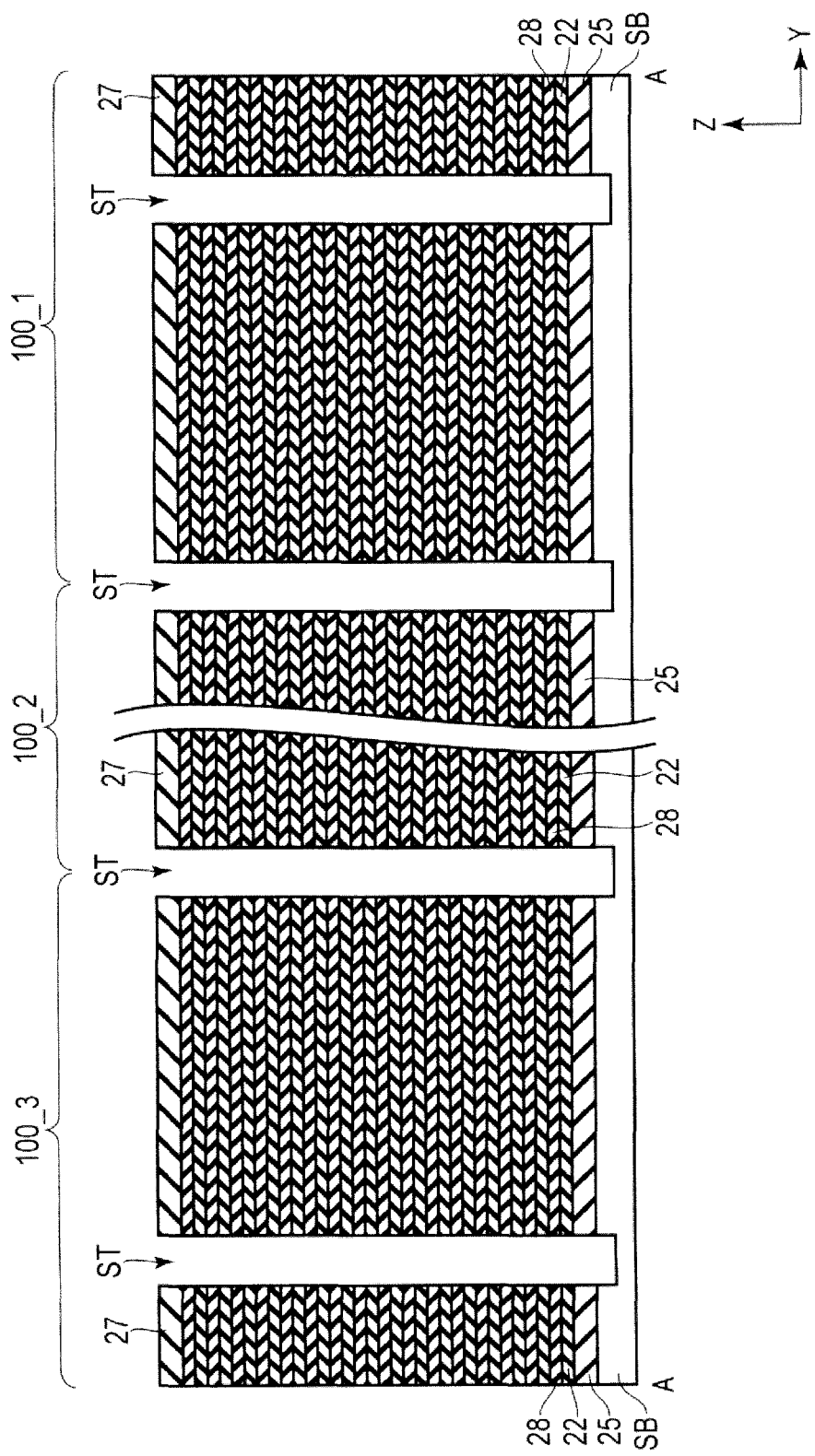
FIG. 9 is a cross-sectional view illustrating a manufacturing step for the semiconductor memory device according to the embodiment.
Figure 10:
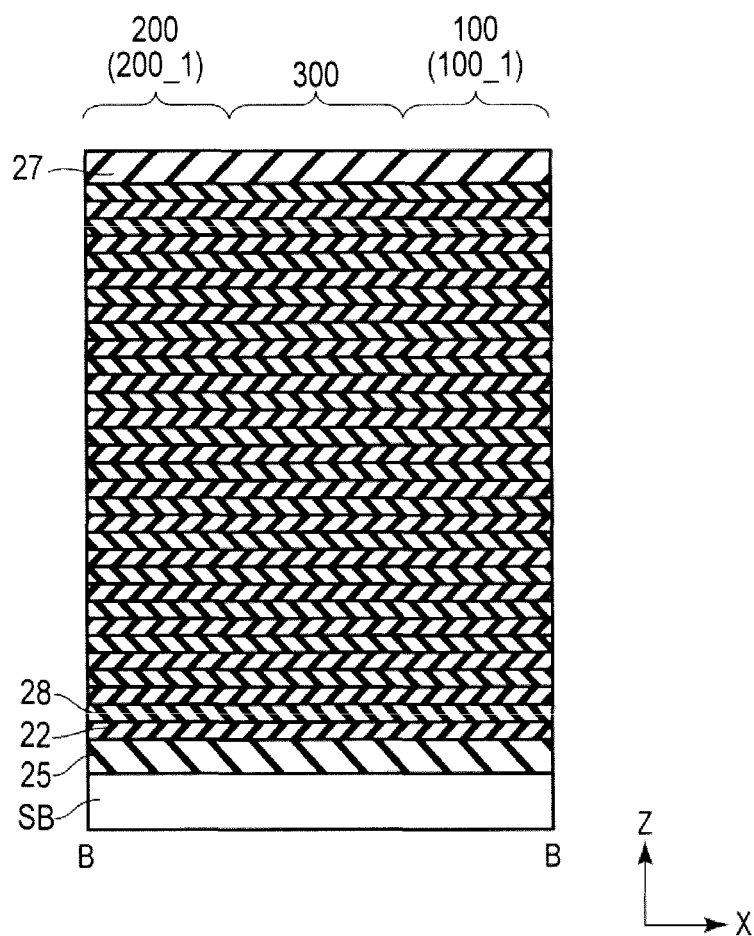
FIG. 10 is a cross-sectional view illustrating a manufacturing step for the semiconductor memory device according to the embodiment.

First, as illustrated in FIGS. 9 and 10, the insulating layer 25 is formed on the semiconductor substrate SB. The plurality of insulating layers 22 and the plurality of insulating layers 28 are alternately formed on this insulating layer 25. Furthermore, the insulating layer 27 is formed on the uppermost insulating layer 28. The insulating layers 22, 25, and 27 contain silicon dioxide and the insulating layers 28 contain silicon nitride.

Next, slits ST are formed between adjacent memory blocks 100_1 to 100_3 and in a central portion (in the Y direction) within each of respective memory blocks 100_1 to 100_3. These slits ST are formed through the thicknesses of the plurality of insulating layers 22, 25 and 28 so as to extend from upper surfaces to lower surfaces thereof. The slits ST extend in the X direction and the Z direction. The plurality of insulating layers 22, 25, 27, and 28 are separated in to different portions/regions by the slits ST.

Figure 11:
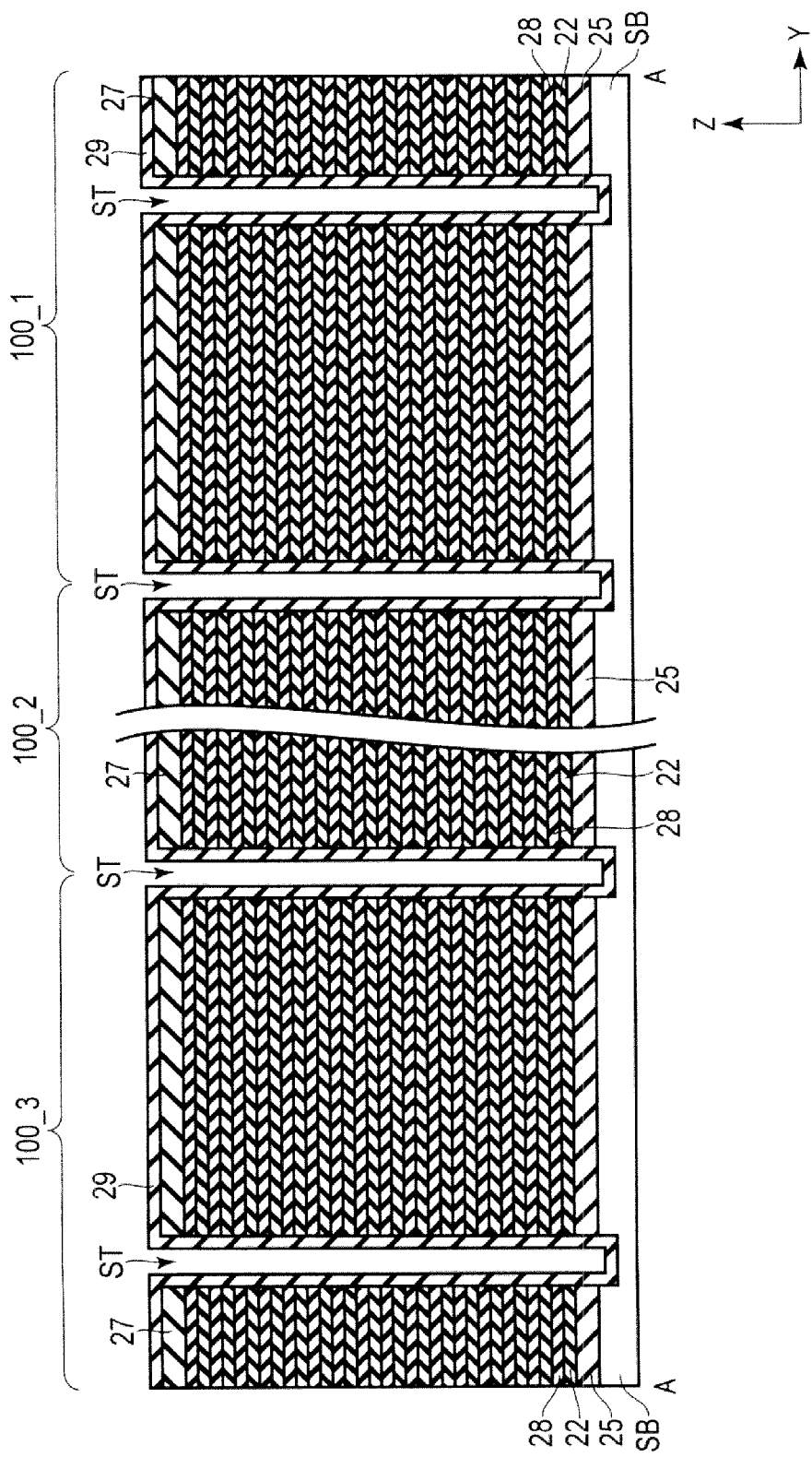
FIG. 11 is a cross-sectional view illustrating a manufacturing step subsequent to the manufacturing step in FIG. 9 for the semiconductor memory device according to the embodiment.
Figure 12:
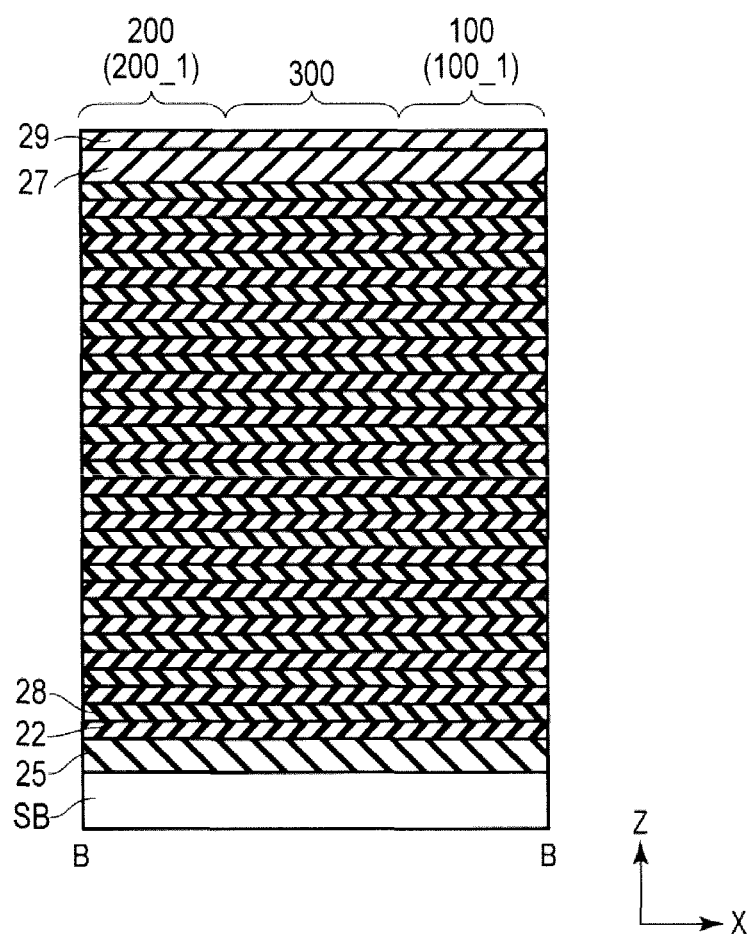
FIG. 12 is a cross-sectional view illustrating a manufacturing step subsequent to the manufacturing step in FIG. 10 for the semiconductor memory device according to the embodiment.

As illustrated in FIGS. 11 and 12, insulating layer 29 is then formed on exposed surfaces of insulating layers 22, 25, 27, and 28 and the semiconductor substrate SB using, for example, ALD (Atomic Layer Deposition) or CVD (Chemical Vapor Deposition). That is, insulating layer 29 covers the upper surfaces of the insulating layers 27 and inner surfaces (side surfaces and bottom surfaces) of the slits ST. The insulating layer 29 contains, for example, silicon dioxide.

As illustrated in FIGS. 13 and 14, a resist 40 is then formed on the insulating layer 29 in the insulating region 300. At this time, as illustrated in FIG. 14, the resist 40 is formed not only in the insulating region 300 but also in regions around (adjacent) the insulating region 300 so as to completely cover the insulating region 300. That is, as illustrated in FIG. 14, the resist 40 is also formed in portions of the hookup region 200 and the memory cell array region 100. Furthermore, as illustrated in FIG. 13, the resist 40 is also in and over some of the slits ST with which the insulating region 300 contacts. Subsequently, the portions of the insulating layer 29 not covered with the resist 40 are removed by RIE (Reactive Ion Etching).

Figure 16:
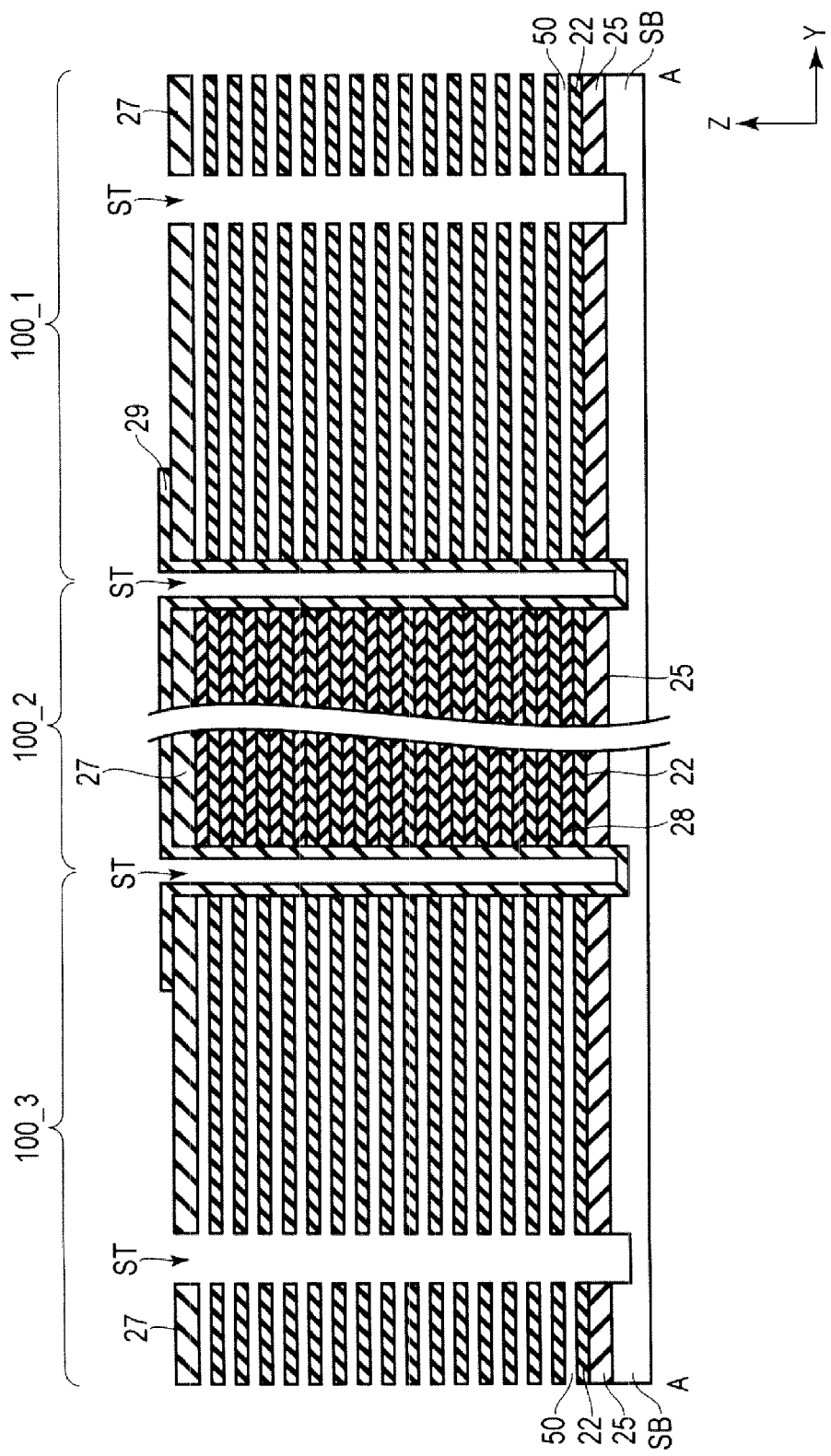
FIG. 16 is a cross-sectional view illustrating a manufacturing step subsequent to the manufacturing step in FIG. 13 for the semiconductor memory device according to the embodiment.
Figure 17:
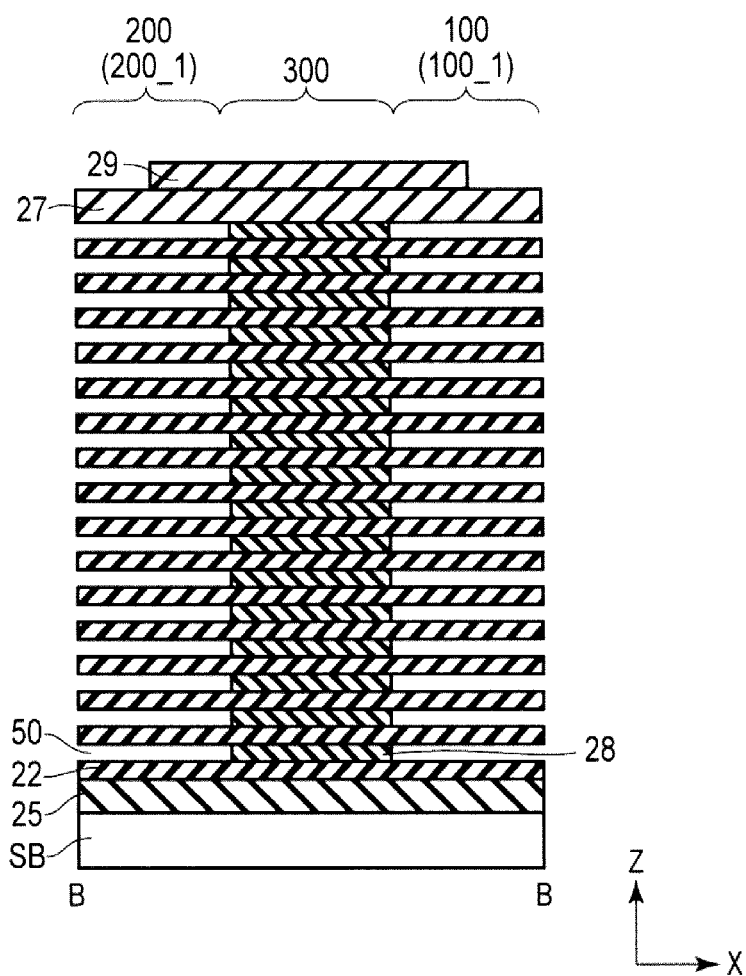
FIG. 17 is a cross-sectional view illustrating a manufacturing step subsequent to the manufacturing step in FIG. 14 for the semiconductor memory device according to the embodiment.

As illustrated in FIGS. 16 and 17, portions of the insulating layers 28 (silicon nitride) outside the insulating region 300 are removed via the slits ST by a wet etching process using, for example, a phosphoric acid solution. The wet etching process leaves the insulating layers 22, 25, and 27 (silicon dioxide). Gaps 50 are thereby formed between the insulating layers 22 in the memory cell array region 100 and the hookup regions 200. At this time, slits ST around the insulating region 300 are still covered with the insulating layer 29 (silicon dioxide). Owing to this, the wet etching that removes the insulating layers 28 is prevented in the insulating region 300 and the insulating layers 28 in the insulating region 300 remain.

Figure 18:
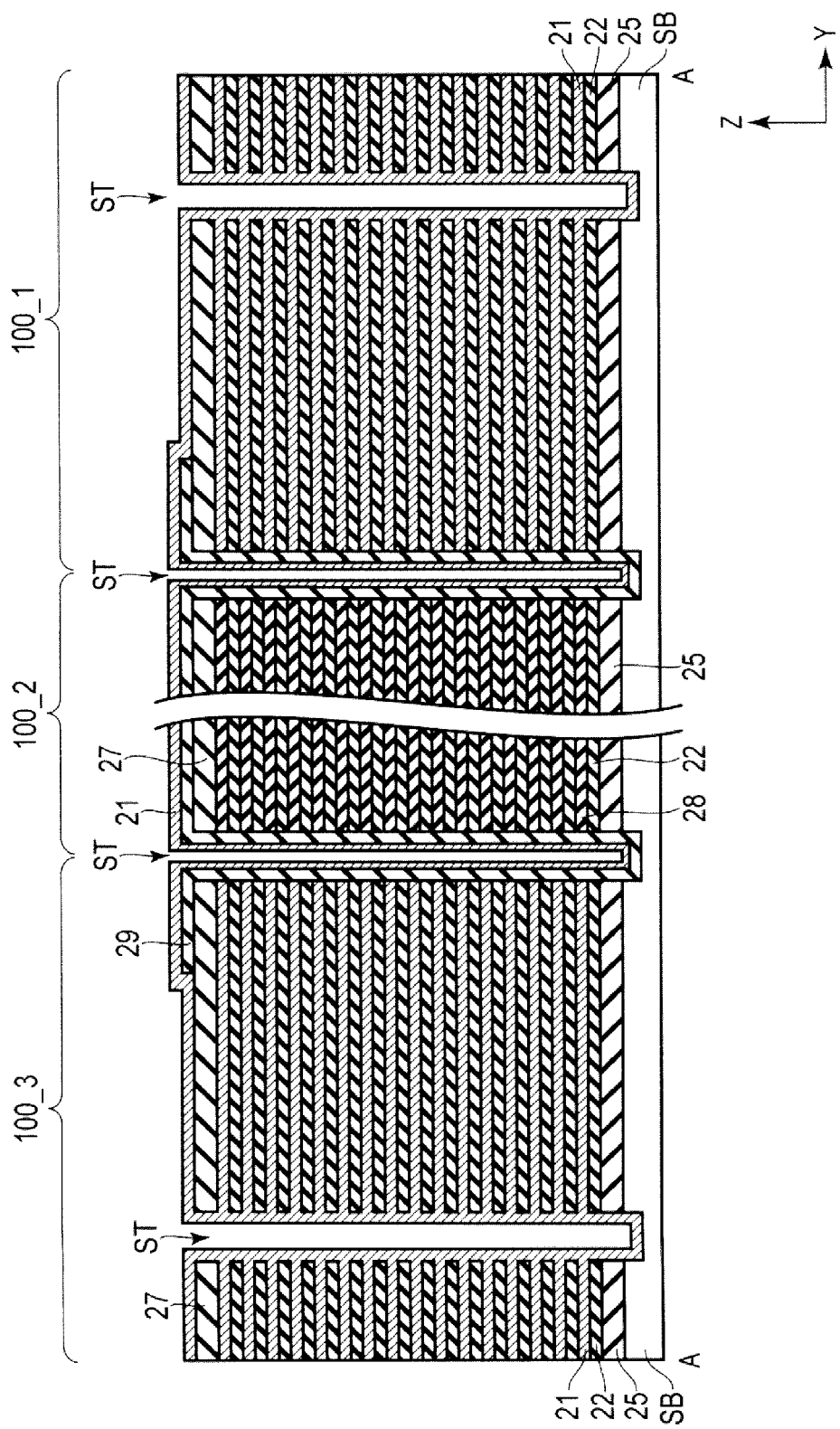
FIG. 18 is a cross-sectional view illustrating a manufacturing step subsequent to the manufacturing step in FIG. 16 for the semiconductor memory device according to the embodiment.

As illustrated in FIG. 18, conductive layers 21 are then formed by, for example, the ALD or the CVD after the stacked films CF (not specifically illustrated) are formed by, for example, the ALD or the CVD. The stacked films CF and the conductive layers 21 are thereby formed to fill the gaps 50. The stacked films CF and the conductive layers 21 are also formed on the inner surfaces (side and bottom surfaces) of the slits ST and on the upper surfaces of the insulating layers 27 and 29.

As depicted in FIGS. 7 and 8, the insulating layer 29 is removed after the conductive layer 21 on the inner surfaces of the slits ST and on the upper surfaces of the insulating layers 27 and 29 has been removed. Subsequently, insulating layer 26 is formed on all exposed surfaces in each region. The portions of the insulating layer 26 formed on the bottom surfaces of the slits ST and on the insulating layers 27 are then removed by, for example, RIE. The material for the source line contacts LI is then embedded in the slits ST.

While in this example the insulating layer 26 and the source line contacts LI are formed after the insulating layer 29 has been removed, the insulating layer 29 does not necessarily have to be removed. That is, the insulating layers 26 and the source line contacts LI may be formed on the insulating layer 29.

Moreover, the memory pillars MP in the memory cell array region 100 can be formed before or after formation of the slits ST. Furthermore, posts (not specifically illustrated) identical in configuration to the memory pillars MP may be formed in the hookup regions 200 simultaneously with formation of the memory pillars MP. The posts can support the insulating layers 22 among which the gaps 50 have been formed.

Advantages of an Embodiment

In a comparative example, slits ST extending in the Y direction would be provided as the insulating regions (isolation regions) 300 illustrated in FIG. 1, and insulating layers and source line contacts would be provided in the slits ST. The word lines WL in the second memory block 100_2 and the word lines WL in the first hookup region 200_1, for example, would thereby be dielectrically isolated.

On the other hand, the word lines WL in the first memory block 100_1 would be connected to (integrated with) the word lines WL in the first hookup region 200_1. Owing to this, as portions for connecting the word lines WL, the first hookup region 200_1 having a stepped shape at the width 2Wb corresponding to widths of two memory blocks in the Y direction can be allocated to the first memory block 100_1. It is, therefore, possible to suppress an increase in a step area in the X direction of the first hookup region 200_1 and reduce an area of the hookup region.

However, in the comparative example, the word lines WL (tungsten) are formed in the gaps 50 after the slits ST are formed. If the word lines WL are formed in the slit ST portions (dividing portions), the slits ST possibly have to be widen or films of the word lines WL are possibly separated from the surface of the slit ST portions due to stress in the device. This stress increases between the word lines WL extending in the X direction and the slits ST (insulating regions 300) extending in the Y direction and an influence of this stress can be conspicuous therebetween. This problem makes it difficult to realize a configuration in which the hookup region for each memory block has a width corresponding to the summed widths of two memory blocks in the comparative example.

In the present embodiment, by contrast, a stacked structure of the insulating layers 22 and the insulating layers 28 is provided as the insulating region (s) 300 illustrated in FIG. 1. This stacked structure (the insulating layers 28 therein, in particular) dielectrically isolates the word lines WL in second memory block 100_2 from the word lines WL in the first hookup region 200_1. This stacked structure is in place before formation of the slits ST. That is, according to the present embodiment, slits ST are not formed within or extending through the insulating region 300 and thus the abovementioned stress-caused problems do not occur at a time of forming the word lines WL. It is thereby possible to realize a configuration in which the hookup region for each memory block has a total width corresponding to the summed widths of the two memory blocks, while reducing the total die area required for the hookup regions that would otherwise be required for hookup regions with the same total width of the present embodiment.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device, comprising:
   a first memory block including:
      a plurality of first conductive layers stacked on a substrate, each first conductive layer being at a different level in a first direction from the substrate and separated from adjacent first conductive layers in the first direction by a first insulation material; and
      a first memory pillar extending in the first direction through the plurality of first conductive layers;
   a first hookup region adjacent in a second direction to the first memory block and including a plurality of second conductive layers stacked on the substrate, each second conductive layer being at a level in the first direction from the substrate that corresponds to one of the plurality of first conductive layers; and
   a first isolation region between the first memory block and the first hookup region in the second direction and including a plurality of first insulating layers of a second insulating material different than the first insulating material, each of the first insulating layers being at a level in the first direction from the substrate that corresponds to one of the plurality of first conductive layers, each first insulating layer being between one of the plurality of first conductive layers and one of the plurality of second conductive layers in the second direction.

2. The semiconductor memory device according to claim 1, further comprising:
   a second memory block adjacent to the first memory block in a third direction orthogonal to the first and second directions and adjacent to the first hookup region in the second direction; and
   a second isolation region between the first memory block and the second memory block in the third direction, wherein
   the second memory block includes:
      a plurality of third conductive layers at the same levels in the first direction from the substrate as the plurality of first conductive layers, the plurality of third conductive layers each being connected to one of the plurality of second conductive layers; and
      a second memory pillar extending in the first direction through the plurality of third conductive layers, and
   the second isolation region isolates the plurality of first conductive layers from the plurality of third conductive layers.

3. The semiconductor memory device according to claim 2, further comprising:
   a second hookup region adjacent to the first memory block in the second direction, the first and second memory blocks being between the first and second hookup regions in the second direction, wherein
   the second hookup region includes a plurality of fourth conductive layers at the same levels in the first direction from the substrate as the plurality of first conductive layers, the plurality of fourth conductive layers each being connected to one of the plurality of first conductive layers.

4. The semiconductor memory device according to claim 1, wherein the plurality of second conductive layers have stepped portions arranged in the second direction and a third direction crossing the second direction, and an upper surface of each of the stepped portions is not covered by other second conductive layers in the plurality of second conductive layers.

5. The semiconductor memory device according to claim 1, wherein a width of the first hookup region in a third direction orthogonal to the first and second directions is twice as large as a width of the first memory block in the third direction.

6. The semiconductor memory device according to claim 1, wherein the first isolation region comprises a plurality of second insulating layers between the plurality of first insulating layers, the plurality of second insulating layers being of the first insulating material.

7. The semiconductor memory device according to claim 6, wherein the second insulating material is silicon nitride and the first insulating material is silicon dioxide.

8. A semiconductor memory device, comprising:
   a first memory block including a plurality of first conductive layers stacked on a semiconductor substrate along a first direction, an insulating layer of a first insulating material being between adjacent first conductive layers in the first direction, and a first memory pillar extending in the first direction through the plurality of first conductive layers to the semiconductor substrate;
   a second memory block adjacent to the first memory block in a second direction and including a plurality of second conductive layers stacked on the semiconductor substrate along the first direction, an insulating layer of the first insulating material being between adjacent second conductive layers in the first direction, and a second memory pillar extending in the first direction through the plurality of second conductive layers to the semiconductor substrate, the plurality of second conductive layers being at levels in the first direction from the semiconductor substrate corresponding to levels of the plurality of first conductive layers;
   a source line contact region between the first and second memory blocks in the second direction;
   a first hookup region adjacent to the first and second memory blocks in a third direction orthogonal to the first and second directions, the first hookup region comprising a plurality of third conductive layers at levels in the first direction from the semiconductor substrate corresponding to levels of the plurality of first conductive layers, each third conductive layers being connected to a second conductive layer at the same level; and
   a first isolation region between the first memory block and the first hookup region and comprising a plurality of second insulating layers of a second insulating material stacked on the semiconductor substrate in the first direction, the insulating layer of the first insulating material being between adjacent second insulating layers in the first direction, the second insulating material being different than the first insulating material, the plurality of second insulating layers being at levels in the first direction from the semiconductor substrate corresponding to levels of the plurality of first conductive layers and electrically separating the plurality of first conductive layers from the plurality of third conductive layers.

9. The semiconductor memory device according to claim 8, wherein the plurality of third conductive layers have stepped portions arranged in the second and third directions.

10. The semiconductor memory device according to claim 9, wherein the first insulating material is silicon dioxide and the second insulating material is silicon nitride.

11. The semiconductor memory device according to claim 8, further comprising:
a second hookup region, the first memory block being between the first and second hookup regions in the third direction and electrically connected to conductive layers in the second hookup region.

12. The semiconductor memory device according to claim 8, wherein the first insulating material is silicon dioxide and the second insulating material is silicon nitride.

13. The semiconductor memory device according to claim 8, wherein the first memory pillar forms a portion of a NAND memory string.

* * * * *